(12) United States Patent
Nin

(10) Patent No.: US 6,734,572 B2
(45) Date of Patent: May 11, 2004

(54) PAD STRUCTURE FOR BONDING PAD AND PROBE PAD AND MANUFACTURING METHOD THEREOF

(75) Inventor: Shu-Liang Nin, Taoyuan City (TW)

(73) Assignee: Nanya Technology Corporation, Taoyuan (TW)

( * ) Notice: Subject to any disclaimer, the term of this patent is extended or adjusted under 35 U.S.C. 154(b) by 43 days.

(21) Appl. No.: 10/150,389

(22) Filed: May 17, 2002

(65) Prior Publication Data

US 2003/0181029 A1 Sep. 25, 2003

(30) Foreign Application Priority Data

Mar. 21, 2002 (TW) ........................................ 91105490 U

(51) Int. Cl.$^7$ ............................................. H01L 23/544

(52) U.S. Cl. ........................ 257/797; 257/776; 257/781; 257/784

(58) Field of Search ........................................ 257/797

(56) References Cited

U.S. PATENT DOCUMENTS

| | | | | |
|---|---|---|---|---|
| 5,022,580 A | * | 6/1991 | Pedder | 228/56.3 |
| 6,392,300 B1 | * | 5/2002 | Koike | 257/758 |
| 6,555,922 B1 | * | 4/2003 | Nakagawa | 257/786 |
| 6,664,642 B2 | * | 12/2003 | Koubuchi et al. | 257/776 |

* cited by examiner

Primary Examiner—Huan Hoang
Assistant Examiner—Thao P. Le
(74) Attorney, Agent, or Firm—Merchant & Gould P.C.

(57) ABSTRACT

A mark-shaped pad. A bonding pad structure with at least one mark-shaped bonding pad comprises: a bottom metal layer disposed over the surface of a rectangular semiconductor substrate to connect the circuit electrically, an inter-metal dielectric layer disposed over the bottom metal layer, metal plugs formed in the inter-metal dielectric layer to connect with the bottom metal layer, a top metal layer disposed over the inter-metal dielectric layer connecting with the metal plugs, and a passivation layer disposed over the top metal layer with openings to expose the top metal layer portions as bonding pads, wherein at least one bonding pad is mark-shaped, e.g. "⌂", "⊔", "+" or "⌐", to indicate the orientation of the bonding pads on the rectangular semiconductor substrate.

8 Claims, 5 Drawing Sheets

PAD STRUCTURE FOR BONDING PAD AND PROBE PAD AND MANUFACTURING METHOD THEREOF

FIELD OF THE INVENTION

The present invention relates to an integrated circuit device structure, and more particularly to a mark-shaped pad structure for a bonding pad and a probe pad.

BACKGROUND OF THE INVENTION

After integrated circuits are formed on a semiconductor wafer, the top metal layer is defined as a plurality of bonding pads to form a multi-layered wiring with the metal lines below. The wafer is then cut into dies for further IC chip electronic packaging.

In the electronic packaging of an IC chip, the dies cut from the wafer are bonded to a lead frame with a bonder, and the bonding pads on the IC chip are electrically connected with corresponding electrical leads on the lead frame by wire bonding. In other words, the bonding pads on IC chips are the interface between the integrated circuits on the semiconductor substrate and the packaging leads on the lead frame to connect electrical signals. The electrical signals can be power signals, ground signals, and/or input/output signals.

Conventionally, the active devices, e.g., MOS transistors or resistances, are laid on the central area (active area) of an IC chip and bonding pads are disposed around the active area to protect the active devices on the active area from damage during wire bonding. In some cases, bonding pads are laid on the central area of IC chip and active devices are disposed around the bonding pads for the same reason.

The conventional shape of a bonding pad is a square or a rectangle. FIG. 1 shows a conventional die array on a wafer. There are scribe lines 16 on a wafer 10 to define several die areas, e.g. 12A and 12B, and the wafer 10 is cut into dies along the scribe lines 16. There are alignment markers (e.g. 14A–14C) disposed at corners of the die areas 12A and 12B on the scribe lines 16 for cutting alignment. For the intact die area 12A, the dicing machine cuts the die area 12A from the wafer 10 by aligning with the markers 14A and 14B which are disposed along the diagonal line of area 12A. However, for the fragmental die area 12B, there is no corresponding diagonal markers on scribe lines for alignment, and therefore, there is difficulty cutting die area 12B.

FIGS. 2A and 2B show a conventional design of bonding pads. In FIG. 2A, the rectangular bonding pads 22A with equal size are disposed along the two longer sides of the rectangular chip 20A which is cut from a wafer. Another bonding pad design is shown in FIG. 2B. The rectangular bonding pads 22B with equal size are disposed on the central area of the rectangular chip 20B which is also cut from a wafer. The electrical layout in the chip 20A or 20B is predetermined and the bonding pads 22A or 22B on the IC chip 20A or 20B respectively are wire bonded with corresponding electrical leads on a lead frame according to the interior layout. However, it is hard to identify the bonding orientation of a chip and the leads on a lead frame because the IC chips 20A and 20B are rectangular and the bonding pads 22A and 22B are disposed on the IC chips 20A and 20B symmetrically.

The same orientation problem occurs on probe pads. The probe pads are disposed in certain positions on a circuit for in-line monitoring or checking the electrical performance of the circuit design. FIG. 3 shows the conventional design for probe pads. There are several tiny probe pads 36 disposed in a certain circuit 34 on IC chip 30. The inspector measures the probe pads 36 on the circuit 34 by using a micro-probe under a microscope to obtain the electrical data.

Since the square-shaped probe pads on the circuit are very tiny (e.g., 5×5 $\mu$m), it is hard and time consuming for an inspector to identify the layout orientation between the probe pads 36 on the circuit 34 under a microscope.

SUMMARY OF THE INVENTION

One object of the present invention is to provide a bonding structure which is used as an orientation marker for wire bonding and a manufacturing method thereof.

Another object of the present invention is to provide a bonding pad structure which can be an alignment marker for wafer dicing.

Still another object of the present invention is to provide a mark-shaped pad structure for probe pads as position markers to identify the orientation of the checking circuits.

To achieve the above-mentioned object, the present invention provides a bonding pad structure disposed on the surface of a semiconductor substrate with a circuit therein and a manufacturing method thereof. The structure comprises a bottom metal layer disposed over the surface of the semiconductor substrate to connect the circuit electrically, an inter-metal dielectric layer disposed over the bottom metal layer, a plurality of metal plugs formed therein to connect with the bottom metal layer below, a top metal layer disposed over the inter-metal dielectric layer connecting with the metal plugs, and a passivation layer disposed over the top metal layer with a plurality of openings to expose the top metal layer portions as bonding pads, wherein at least one bonding pad is mark-shaped to indicate the orientation of the bonding pads on the semiconductor substrate.

According to the present invention, the shape of the mark-shaped bonding pad on the above bonding pad structure can be, for example, a "凸" shape, a "凵" shape, a cross shape "+" or a "Γ" shape.

According to the present invention, the top metal and the bottom metal layers on the bonding pad structure can be, for example, an alloy of aluminum and copper or an alloy of aluminum, copper and silica. The inter-metal dielectric layer can be silicon oxide and the passivation layer can be silicon oxide or borophosphosilicate glass and silicon nitride.

The mark-shaped bonding pads on a wafer can be used as alignment markers for wafer dicing. The dicing machine can cut dies from a wafer by aligning with the mark-shaped bonding pads on the wafer surface. When the dies are cut from the wafer for further wire bonding, the orientation of circuits in the dies can be easily identified according to the mark-shaped bonding pads on the die surface.

A probe pad with a mark-shape is further provided according to the present invention. The probe pad is disposed on a semiconductor circuit for electric characteristic measurement which has a mark-shape to indicate the relative location of the probe pad on the semiconductor circuit.

According to the present invention, the shape of the mark-shaped probe pad on the semiconductor circuit can be, for example, a "凸" shape, a "凵" shape, a cross shape "+" or a "Γ" shape. The probe pad can be, for example, an alloy of aluminum and copper or an alloy of aluminum, copper and silica.

An inspector can easily identify the orientation of the target circuit under a microscopic with the mark-shaped probe pads according to the present invention.

BRIEF DESCRIPTION OF THE DRAWINGS

The present invention will become more fully understood from the detailed description given herein below and the accompanying drawings, given by way of illustration only and thus not intended to be limitative of the present invention. In the drawings, FIG. 1 schematically shows a conventional die array on a wafer.

DETAILED DESCRIPTION OF THE INVENTION

This invention will be described in further detail by way of example with reference to the accompanying drawings.

Figure 1:
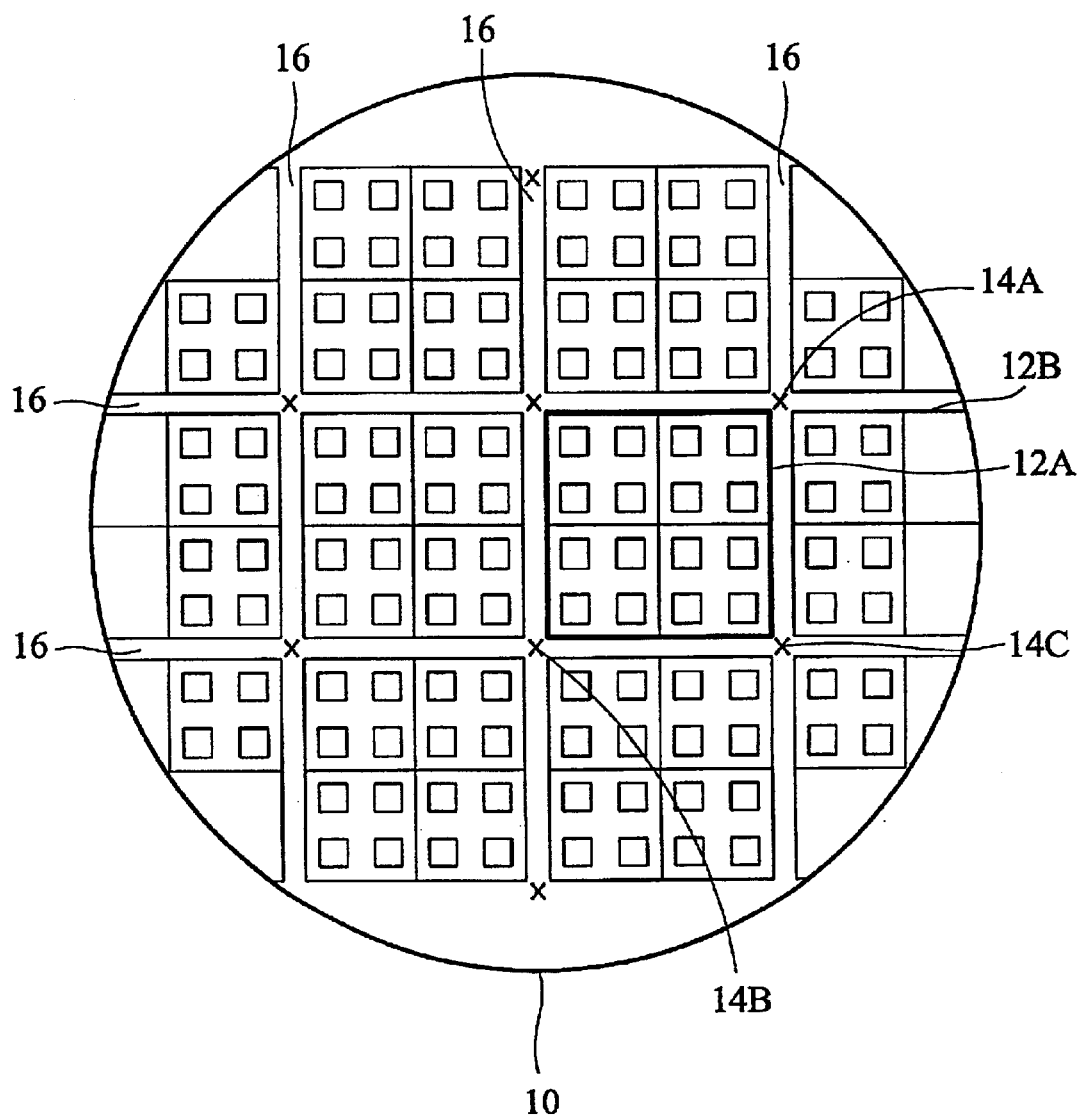
Figure 2A:
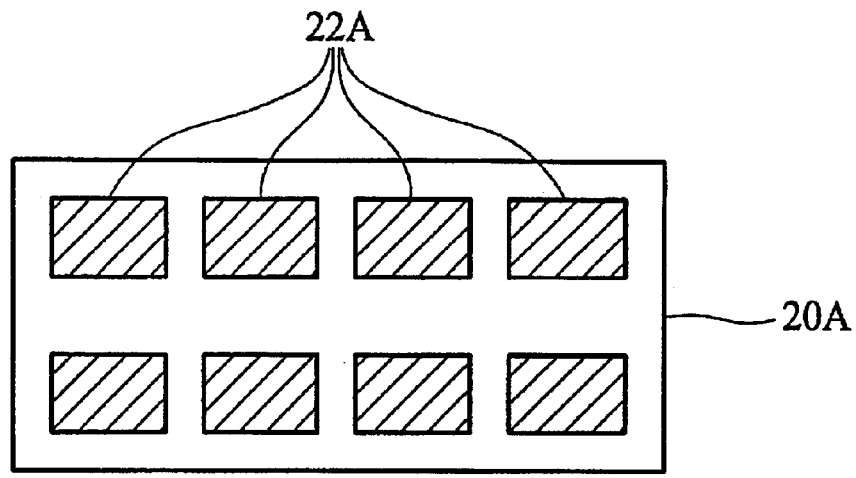
FIGS. 2A and 2B schematically show the conventional design of bonding pads (a plan view)
Figure 2B:
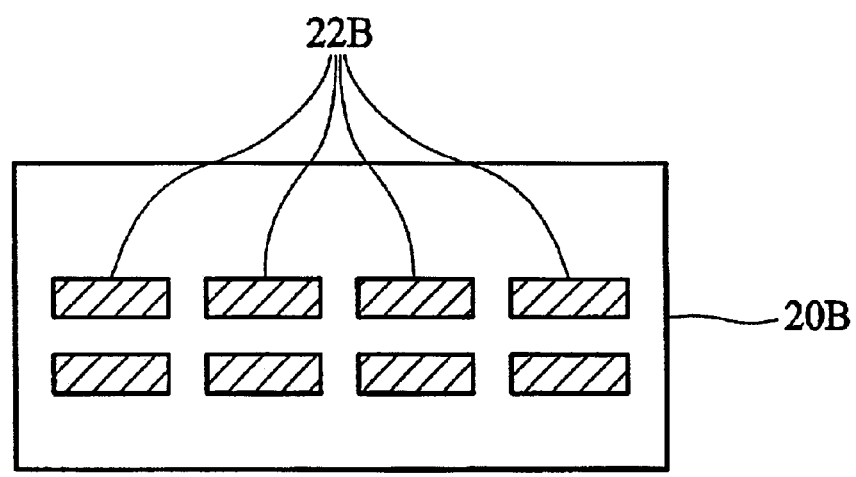
Figure 3:
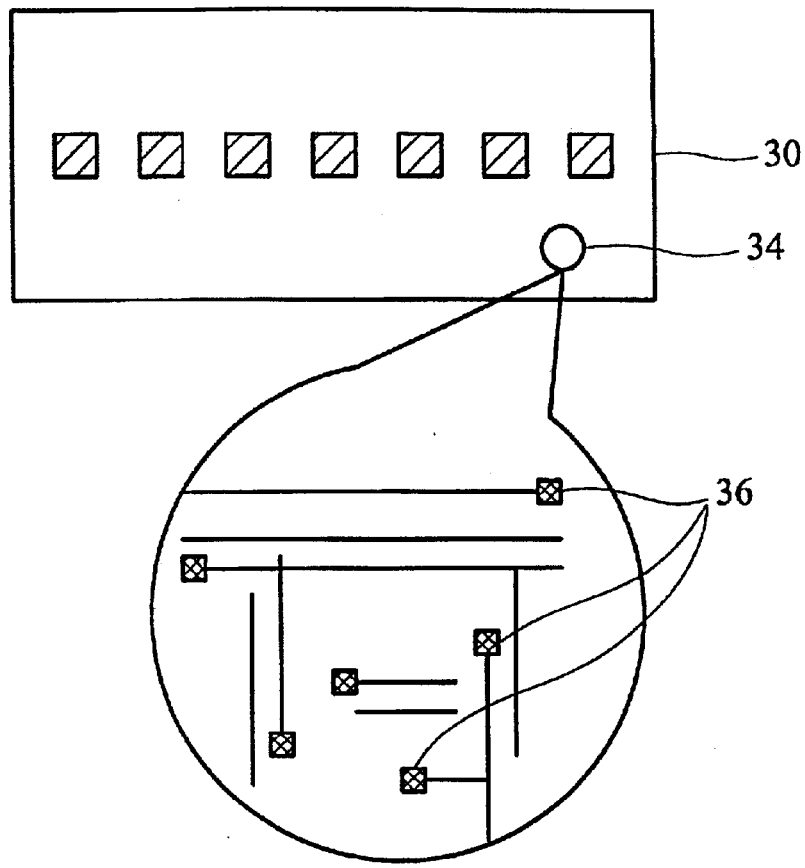
FIG. 3 schematically shows the conventional design for probe pads (a plan view)
Figure 4:
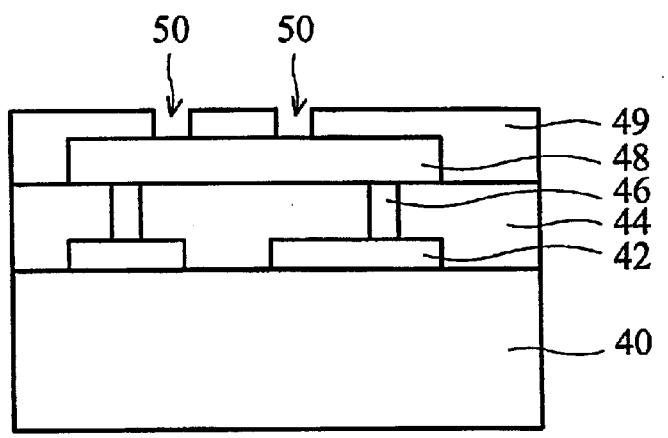
FIG. 4 schematically shows a bonding pad structure according to one embodiment of the present invention.

FIG. 4 is a cross-sectional view showing a bonding pad structure according to one embodiment of the present invention. A bonding pad structure is formed on the surface of a semiconductor substrate 40 with a circuit (not shown) therein. A bottom metal layer 42 is disposed over the surface of the semiconductor substrate 40 and connected with the circuit electrically on the semiconductor substrate 40. The preferred bottom metal layer 42 is an alloy of aluminum and copper or an alloy of aluminum, copper and silica. An inter-metal dielectric layer 44 is then disposed over the bottom metal layer 42. A plurality of metal plugs 46 is then formed in the inter-metal dielectric layer 44 to connect with the bottom metal layer 42 in below. The inter-metal dielectric layer 44 can be, but is not limited to, silicon oxide.

A top metal layer 48 is disposed over the inter-metal dielectric layer 44 and connected electrically with the metal plugs 46 in the inter-metal dielectric layer 44. A preferred top metal is an alloy of aluminum and copper or an alloy of aluminum, copper and silica. A passivation layer 49 is disposed over the top metal layer 48. A plurality of openings is defined thereon to expose the top metal portions below (e.g. 40×40 μm per opening) as bonding pads 50 for wire bonding. The passivation layer 49 can be a silicon oxide layer or a layer of borophosphosilicate glass (BPSG) and silicon nitride. At least one opening 50 is defined as a certain shape to form a mark-shaped bonding pad on the semiconductor substrate 40. For example, in having at least one mark-shaped bonding pad on the semiconductor substrate 40, it can be used to indicate the orientation of the circuit in the semiconductor substrate 40.

Figure 5A:
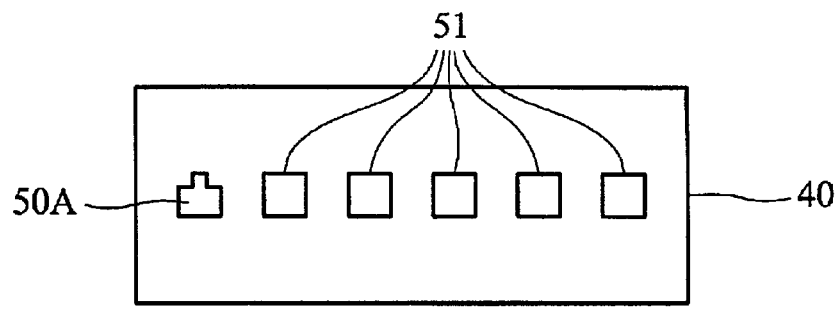
FIGS. 5A–5D schematically show the shapes of bonding pads (a plan view) according to one preferred embodiment of the present invention.
Figure 5B:
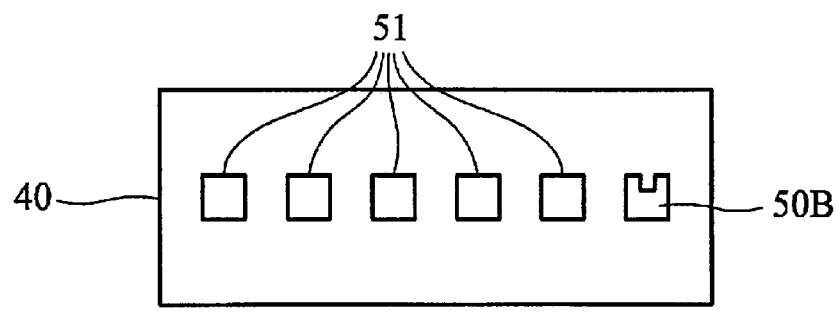
Figure 5C:
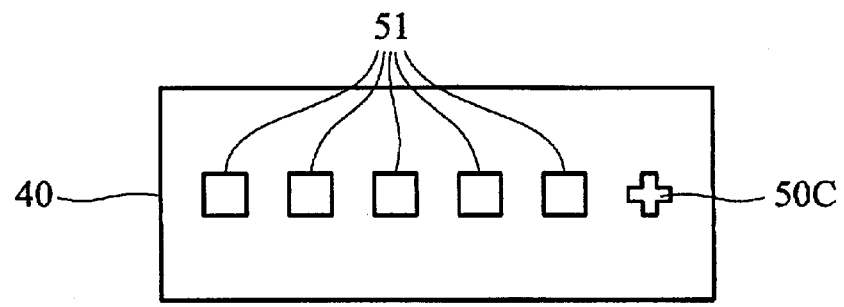
Figure 5D:
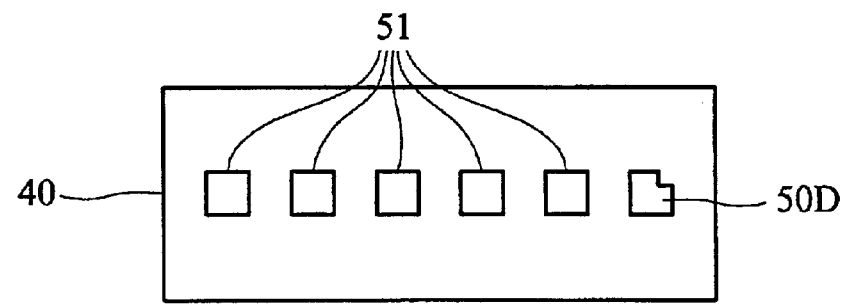

The preferred shapes of the mark-shaped bonding pads formed on the semiconductor substrate 40 are shown in FIGS. 5A to 5D (plan views). The mark-shaped bonding pad on a rectangular semiconductor substrate 40 can be a "⌐⌙" shape 50A as FIG. 5A shows, a "⌴" shape 50B as FIG. 5B shows, a cross shape "+" 50C as FIG. 5C shows or a "⌈" shape as FIG. 50D shows.

According to the present invention, there are two advantages of the mark-shaped bonding pads 50A to 50D that have special shapes other than conventional rectangular bonding pads on the semiconductor substrate 40. One advantages is the mark-shaped bonding pads 50A to 50D can be used as alignment markers for wafer dicing. In addition to conventional markers on scribe lines, a dicing machine can cut dies from a wafer by aligning the mark-shaped bonding pads on the wafer surface, especially when cutting the fragmental portions of a wafer.

Another advantage of the mark-shaped bonding pads in the present invention is that it is easy to identify the orientation of the rectangular semiconductor substrate 40 with the mark-shaped bonding pads 50A to 50D. As shown in FIGS. 5A–5D, there are bonding pads lined up in a row on the surface of the rectangular semiconductor substrate 40. There is difficulty identifying the orientation of the rectangular semiconductor substrate 40 only with the rectangular bonding pads 51. However, it is easy to identify the orientation of the rectangular semiconductor substrate 40 according to the invention by defining a least one bonding pad as a mark-shaped bonding pad, e.g. bonding pads 50A–50D.

Therefore, the relative position between the mark-shaped bonding pads 50A–50D and the other normal rectangular bonding pads denotes the orientation of circuits in the semiconductor substrate 40. Although the circuits layout cannot be seen from the surface of the rectangular semiconductor substrate 40, the orientation of the circuits can still be identified according to the mark-shaped bonding pads on the surface, which makes wire bonding easier to connect the interior circuit by bonding the bonding pads with corresponding leads on a lead frame.

Figure 6:
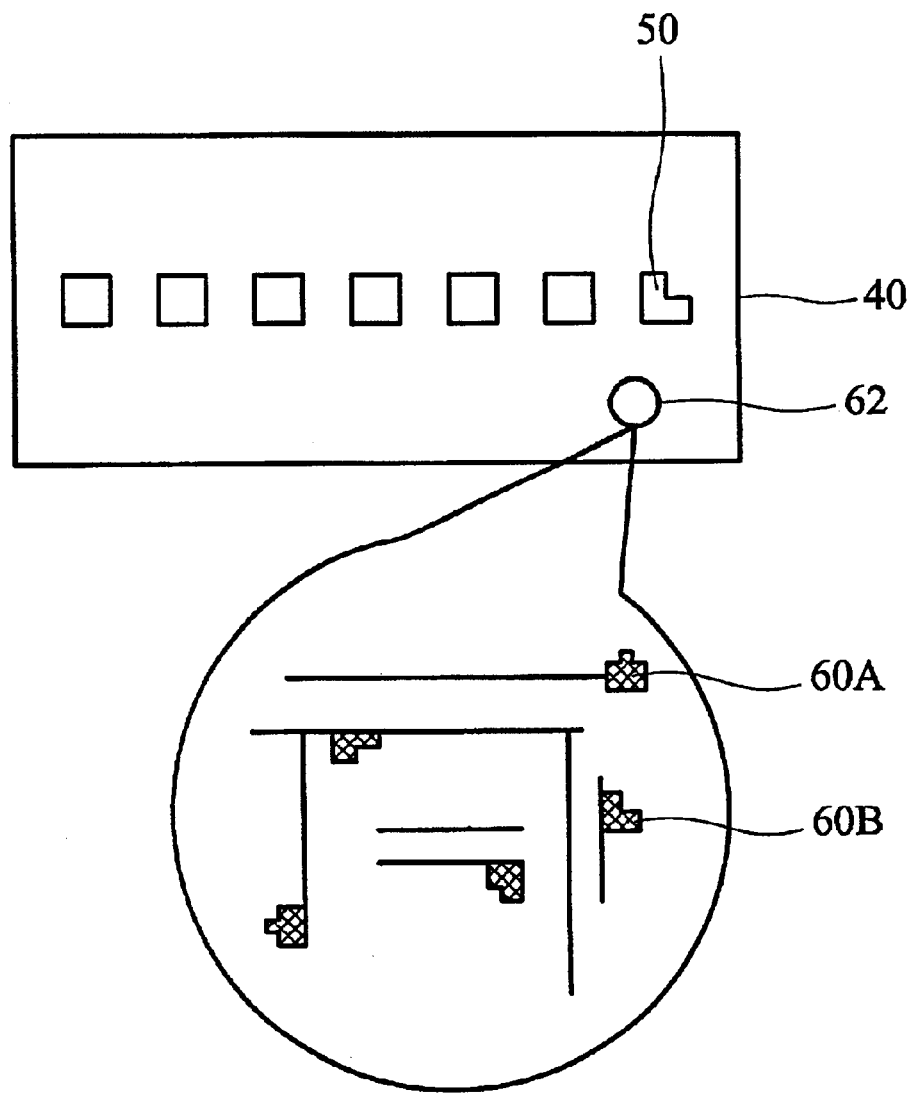
FIG. 6 schematically shows a probe pad (a plan view) according to one embodiment of the present invention.

According to the present invention, a probe pad is further provided. FIG. 6 shows a schematic plan view of a probe pad design according to one embodiment of the invention. There is a mark-shaped bonding pad 50 disposed on the surface of a rectangular semiconductor chip 40 to indicate the substrate 40's orientation and there is a checking area 62 on the semiconductor chip 40. A plurality of mark-shaped probe pads is disposed on certain circuits inside the checking area 62, e.g. a "⌐⌙" shape probe pad 60A or a "⌈" shape probe pad 60B. The preferred probe pads can be, for example, an alloy of aluminum and copper or an alloy of aluminum, copper and silica.

The electric performance of certain circuits on the checking area 62 is obtained by removing the surface of the area 62 and then measuring the interior probe pads with a micro-probe under a microscope. Since the microscope magnifies the scale of the checking area 62, an inspector can clearly identify the orientation of the checking area 62 according to the mark-shaped probe pads 60A or 60B on the checking circuits. According to the present invention, it is easier to identify the circuit orientation with the mark-shaped probe pads than the conventional rectangular probe pads on the checking circuits, and therefore, the in-line monitoring or electrical checking of the circuits are more efficient.

The mark-shaped pads according to the present invention can be applied on a bonding pad structure on the surface of a semiconductor chip or a probe pad on a circuit. A bonding pad structure with at least one mark-shaped pad can be used as an alignment marker of wafer dicing and/or an indicator of chip orientation in wire bonding. Mark-shaped probe pads on circuits of a checking area can be used as indicators showing the relative positions with each other.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bonding pad structure disposed on a surface of a semiconductor substrate with a circuit therein, comprising:
   a bottom metal layer disposed over the surface of the semiconductor substrate to connect the circuit electrically;
   an inter-metal dielectric layer disposed over the bottom metal layer;
   a plurality of metal plugs formed therein the inter-metal dielectric layer to connect with the bottom metal layer;
   a top metal layer disposed over the inter-metal dielectric layer connecting with the metal plugs; and
   a passivation layer disposed over the top metal layer with a plurality of openings to expose the top metal layer portions as bonding pads, wherein at least one bonding pad is mark-shaped to indicate the orientation of the bonding pads on the semiconductor substrate.

2. The bonding pad structure as claimed in claim 1, wherein the mark-shaped bonding pad is a "⌂" shape.

3. The bonding pad structure as claimed in claim 1, wherein the mark-shaped bonding pad is a "⊔" shape.

4. The bonding pad structure as claimed in claim 1, wherein the mark-shaped bonding pad is a cross shape "✚".

5. The bonding pad structure as claimed in claim 1, wherein the mark-shaped bonding pad is a "Γ" shape.

6. The bonding pad structure as claimed in claim 1, wherein the top and bottom metal layers are an alloy of aluminum and copper or an alloy of aluminum, copper and silica.

7. The bonding pad structure as claimed in claim 1, wherein the inter-metal dielectric layer is silicon oxide.

8. The bonding pad structure as claimed in claim 1, wherein the passivation layer is silicon oxide or borophosphosilicate glass and silicon nitride.

\* \* \* \* \*